(12) United States Patent
Hopkins et al.

(10) Patent No.: US 8,122,400 B2
(45) Date of Patent: Feb. 21, 2012

(54) LOGIC DIFFERENCE SYNTHESIS

(75) Inventors: Jeremy T. Hopkins, Round Rock, TX (US); John M. Isakson, Austin, TX (US); Joachim Keinert, Altdorf (DE); Smita Krishnaswamy, New York, NY (US); Nilesh A. Modi, Santa Barbara, CA (US); Ruchir Puri, Baldwin Place, NY (US); Haoxing Ren, Austin, TX (US); David L. Rude, Wendell, NC (US)

(73) Assignee: International Business Machines Corporation, Armonk, NY (US)

( * ) Notice: Subject to any disclaimer, the term of this patent is extended or adjusted under 35 U.S.C. 154(b) by 361 days.

(21) Appl. No.: 12/497,499

(22) Filed: Jul. 2, 2009

(65) Prior Publication Data

US 2011/0004857 A1   Jan. 6, 2011

(51) Int. Cl.
*G06F 17/50* (2006.01)

(52) U.S. Cl. ........ 716/104; 716/100; 716/101; 716/106; 716/107

(58) Field of Classification Search .................. 716/100, 716/101, 104, 106, 107
See application file for complete search history.

(56) References Cited

U.S. PATENT DOCUMENTS

| | | | | |
|---|---|---|---|---|
| 6,226,777 | B1 | 5/2001 | Zhang | 716/5 |
| 6,453,454 | B1 | 9/2002 | Lee | 716/11 |
| 6,651,239 | B1 | 11/2003 | Nikitin | 716/18 |
| 7,231,626 | B2 | 6/2007 | Hoff | 716/13 |
| 7,992,123 | B2 * | 8/2011 | Hsin | 716/132 |
| 2006/0075370 | A1 | 4/2006 | Williams | 716/11 |
| 2006/0277512 | A1 | 12/2006 | Kucukcakar | 716/6 |
| 2007/0271537 | A1 | 11/2007 | Budumuru | 716/5 |
| 2008/0077900 | A1 | 3/2008 | Oh | 716/11 |
| 2008/0222595 | A1 | 9/2008 | Hsin | 716/18 |

OTHER PUBLICATIONS

G. Swamy, et al. "Minimal Logic Re-synthesis for Engineering Change," ISCAS 1997, pp. 1596-1599.
C-C. Lin, et al. "Logic Synthesis for Engineering Change," TCAD, vol. 18, No. 3, 1999, pp. 282-292.

(Continued)

*Primary Examiner* — Sun Lin
(74) *Attorney, Agent, or Firm* — George Sai-Halasz; Preston J. Young

(57) ABSTRACT

A computer executed method is disclosed which accepts an original circuit with an original logic, accepts a modified circuit, and synthesizes a difference circuit. The difference circuit represents changes that implement the modified circuit's logic for the original circuit. The synthesis may locate an output-side boundary in the original logic in such a manner that the original logic is free of logic changes in between the output-side boundary and the primary output elements of the original circuit. The disclosed synthesis may also locate an input-side boundary in the original logic in such a manner that the original logic is free of logic changes in between the input-side boundary and the primary input elements of the original circuit. A computer program products are also disclosed. The computer program product contains a computer useable medium having a computer readable program code embodied therein. The computer readable program code when executed on a computer causes the computer to carry out the methods of finding input and output side boundaries in an original logic, and synthesizing in between those boundaries a difference circuit representing logic changes.

19 Claims, 11 Drawing Sheets

OTHER PUBLICATIONS

D. Kirovski, et al. "Engineering Change Protocols for Behavioral and System Synthesis," TCAD vol. 24, No. 8, 2005, pp. 1145-1155.
A. Abdollahi, et al. "Symmetry Detection and Boolean Matching Utilizing a Signature-Based Canonical Form of Boolean Functions," TCAD vol. 27, No. 6, 2008, pp. 1128-1137.
D. Brand, et al. "Incremental Synthesis," ICCAD, 1994, pp. 14-18.
K.-H. Chang, et al. "Fixing Design Errors with Counterexamples and Resynthesis" TCAD, vol. 27, No. 1, 2008, pp. 184-188.
A. C. Ling, et al. "Towards Automated ECOs in FPGAs," Proc. Internl. Symp. on Field Programmable Gate Arrays, 2009, pp. 3-12.
A. Mishchenko, et al. "FRAIGs: A Unifying Representation for Logic Synthesis and Verifcation," ERL Techntical Report, Berkeley http://embedded.eecs.berkeley.edu/mvsis/doc/2004/fraigs.pdf 2004, pp. 1-7.
S. Safarpour, et al. "Improved Design Debugging using Maximum Satisfiability", 7-th Internl. Conf. on FMCAD 2007, pp. 13-19.
T. Shinsha, et al. Incremental Logic Synthesis Through Gate Logic Structure Identification, DAC 1986, pp. 391-397.
Q. Zhu, et al. "SAT sweeping with LocalObservability Don't-Cares," DAC 2006, pp. 229-234.

* cited by examiner

LOGIC DIFFERENCE SYNTHESIS

BACKGROUND

The present invention relates to integrated circuit (IC) design. In particular, it relates to implementing logic changes in a synthesized, placed, routed, and optimized circuit.

Circuit designers know that in existing logic flows even a small change in the specification can lead to large changes in the implementation. More generally, there is need for computer aided design (CAD) methodologies to allow for transformations that are incremental. Logic synthesis remained a bottleneck in incremental design.

BRIEF SUMMARY

A computer executed method is disclosed. The method accepts an original circuit, which original circuit has an original logic, with the original logic having primary output elements. The method also accepts a modified circuit, which modified circuit represents a modified logic for the original circuit. The method synthesizes a difference circuit, which difference circuit represents changes to the original logic. These changes implement the modified logic for the original circuit. The synthesis locates an output-side boundary in the original logic in such a manner that the original logic inbetween the output-side boundary and the primary output elements is free of logic changes.

A further computer executed method is also disclosed. The method accepts an original circuit, which original circuit has an original logic, with the original logic having primary input elements. The method also accepts a modified circuit, which modified circuit represents a modified logic for the original circuit. The method synthesizes a difference circuit, which difference circuit represents changes to the original logic. These changes implement the modified logic for the original circuit. The synthesis locates an input-side boundary in the original logic in such a manner that the original logic inbetween the input-side boundary and the primary input elements is free of logic changes.

Computer program products are also disclosed. The computer program products contain computer useable medium having a computer readable program code embodied, such that the computer readable program code when executed on a computer causes the computer to carry out the methods of finding input and output side boundaries in an original logic as described in the two preceding paragraphs.

BRIEF DESCRIPTION OF THE DRAWINGS

These and other features of embodiments of the invention will become apparent from the accompanying detailed description and drawings, wherein.

DETAILED DESCRIPTION

Figure 1:
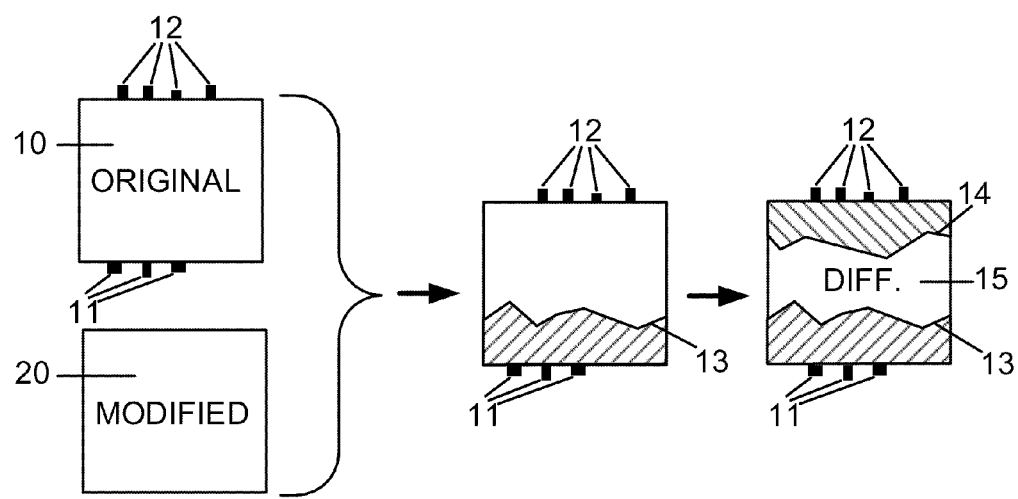
FIG. 1 shows an embodiment of the disclosed method in a symbolic representation.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "logic," or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the description of the computer executable method and/or the flowcharts and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Integrated circuits (IC) at times may have to undergo functional modifications. Frequently, such functional modifications are expressed as an engineering change order (ECO). Often the needed modifications may be quite minor, incremental in nature. In spite of the medications being relatively minor, possibly extending to only a small fraction of the logic functions of the IC, the logically modified IC is typically redone from the start, as it were a new design. Redesigning logic, however, may involve high costs in terms of design effort and time.

There are difficulties implementing even small functional changes incrementally into an existing IC design. IC logic design is a highly automated process, typically called computer aided design (CAD). During CAD, logic optimizations can render intermediate signals in the IC unrecognizable, usually prohibiting simple manual repair of the existing logic. Also, there is an inherent randomness in automated optimization choices. This randomness may make the design process unstable, i.e., a slight modification of the specification can lead to a completely different implementation, one that is practically unrecognizable relative to the original IC.

Embodiments of this disclosure present a computer executed method, and a system, for producing a synthesized delta, namely the logic difference, between the modified design and the original design of the IC. The method may be named "DeltaSyn" for the obvious reason that it synthesizes a difference, or delta. This synthesized difference may be simply treated as a new circuit, which preferably may be quite small in comparison to the original IC, and which difference can be synthesized and inserted into the original IC.

An engineering change order (ECO) deep in a design cycle maybe a common reason for having to implement logic changes into an essentially completed design. However, ECO may not be the only such reason, there maybe other causes. For instance, a subsequent generation of a design maybe quite similar to the older one, and would be desirable to avoid full redesign. Or, for instance, the function of two IC-s are physically merged onto the same chip, and to accommodate this, the IC-s need slightly modified logic. From the point of view of the embodiments of the present invention, it is immaterial what the origin for a logic modification is, whether it is an ECO, or a differing reason. Any and all sources of logic change are within the capabilities of the disclosed methods and system.

For clarifying nomenclature, and for reference to the terms used in the present specification, there are three circuits of note involved with embodiments of the present method.

First, the original circuit. This is the original synthesized, placed, routed, and optimized design, having the original logic.

Second, the modified circuit. This is represented by a modified logic, expressing the functional modifications for the original circuit. In representative embodiments the modified circuit is given as an ECO specification, as a Register Transfer Level (RTL) specification change for the original circuit. In the following the terms modified circuit, modified logic, will be interchangeably used with the term ECO specification. In the Figures, and in displayed program segments the qualifiers "mod" and "eco" are also intended to have equivalent meaning.

Third, the difference circuit. The difference circuit represents the changes to the original circuit required to implement the modified logic of the ECO specification. The set of gates in the difference circuit represent new gates added to the original circuit. Wires in the difference circuit represent connections among these new gates. The new primary inputs and the new primary outputs of the difference circuit are annotated by connections to existing gates and/or pins of the original circuit.

FIG. 1 shows an embodiment of the disclosed method in a symbolic representation. The original design, or original IC 10 and the functional modifications 20, typically expressed in an ECO, are the inputs accepted by the computer executed method of the present disclosure. The original circuit 10 has an original logic. The functional modifications 20, also referred to henceforth as the modified circuit 20, which modified circuit 20 represents a modified logic for the original circuit.

The original circuit 10 contains sequential members called "latches" as well as combinational/logic gates. The original logic is having primary outputs, latch inputs, primary inputs, and latch outputs. The term "primary input elements" 11 as used henceforth means the actual primary inputs and the latch outputs of the original logic. Similarly, the term "primary output elements" 12 as used henceforth means the actual primary outputs and the latch inputs of the original logic.

The disclosed methods may locate an input-side boundary 13 and may locate an output-side boundary 14 in the original logic. Inbetween these boundaries 13, 14 a difference circuit 15 is synthesized, which difference circuit 15 represents changes to the original logic. The changes represented by the difference circuit 15 implement the modified logic for the original circuit.

The difference circuit 15, once synthesized as confined between the two boundaries 13, 14, may be treated as any new circuit, and may itself be reduced in size with logic optimization techniques.

As stated, FIG. 1 is a symbolic representation. The square shapes, such as 10 and 20, carry no meaning of their own. The boundaries 13, 14 are in an abstract space of logic, and in no way are they meant to imply, for instance, some sort of physical boundary on a semiconductor chip. In a placed circuit, these boundaries would most likely appear as randomly scattered circuit elements, typically pins.

The meaning of the input-side boundary 13, and of the elements of the input-side boundary may be further elucidated, as follows. There is a method, let's name it "first method", which starting at the primary input elements 11, searches into the logic, and successively finds circuit elements with the property that inbetween these elements and the primary input elements 11, from where the first method commenced, the original logic is in no need for logic changes, i.e. it is free of changes. Let's name such circuit elements as "suitable elements". The input-side boundary 13 is made up of suitable elements having the additional property that they are at the end of the search by the first method. Where the first method stops finding suitable elements, the last one found becomes a constituent of the input-side boundary 13.

It is essentially identical for the circuit elements making up the output-side boundary 14. There is a method, let's name it "second method", which starting at the primary output elements 12, searches backwards into the logic and successively finds circuit elements with the property that inbetween these elements and the primary output elements 12, from where the second method commenced, the original logic is in no need for logic changes, i.e. it is free of changes. We can name such circuit elements again, without loss of clarity, as "suitable elements". The output-side boundary 14 is made up of suitable elements having the additional property that they are at the end of the search by the second method. Where the second method stops finding suitable elements, the last one found becomes a constituent of the output-side boundary 14.

From the presented characterizations of the input and output side boundaries, it is clear that FIG. 1 should not be interpreted restrictively as per the positions of these boundaries 13, 14, either. It is quite possible, for instance, for the first method not to find any suitable element when starting a specific primary input element. This means that at that point the that specific primary input element, itself, becomes a constituent of the input-side boundary 13. It is as if in some places the input-side boundary 13 "touched" the primary input elements 11. It may also happen that the first method along a particular logic search penetrates through the whole original circuit, and reaches a primary output element. In this case, that specific primary output element, itself, becomes a constituent of the input-side boundary 13. It is as if in some places the input-side boundary 13 "touched" the primary output elements 12, meaning, of course, that along that particular path the original circuit if free of changes from a primary input element to a primary output element.

It is essentially the same for the output-side boundary and for the second method, as well. Without repeating the details, as presented above in the paragraph for the input-side boundary, for some original circuits and modified circuits it can happen that the output-side boundary "touches" either primary output elements 12, or the primary input elements 11.

It is also quite conceivable that a given circuit element can be found either by the first method, or the second method. Meaning, again, that for the logic path passing through that given circuit element the original circuit if free of changes from a primary input element to a primary output element. In such a case the given circuit element can be assigned to either the input-side, or to the output-side boundary. The two boundaries "touch". One may, of course, introduce methodologies for consistently assigning such potentially double finds, to one, or the other boundary. If there is no other compelling reason, the common element may be assigned, for instance, depending weather it was found first by the first, or the second method.

All of the discussed configurations of the input-side boundary 13 and the output-side boundary 14, without limiting further possibilities, are covered by the embodiments of the present invention.

The circuit elements making up the boundaries become the primary inputs and primary outputs for the difference circuit 15, which is stitched into the original circuit to implement the modified logic. Consequently, the logic changes represented by the difference circuit 15 are confined inbetween the input-side boundary 13 and the output-side boundary 14.

Examples for the above discussed first and second methods are also introduced by embodiments of the present disclosure. An example of the first method, which operates commencing at the primary input elements 11, is summarized in the flowchart of FIG. 2. While, an example of the second method, which operates commencing at the primary output elements 12, is summarized in the flowchart of FIG. 4.

Embodiments of the method make no assumption regarding the degree by which the original and the modified circuit are different. Although, typically ECO modifications are small, the disclosed method is highly scalable to any size problem.

A computer executed design method has many known way to accept a circuit definition. Any and all known manner of circuit representation is acceptable for embodiment of the present disclosure. In a representative embodiment of the disclosed computer executed method, both the original and the modified circuits may be accepted in the form of netlists. Often integrated circuits, including ECOs, may be specified by a higher level hardware description language, such as VHDL, or Verilog™, or other known such languages in the art. For embodiments of the present disclosure any and all such language descriptions for either the original circuit, and/or the modified circuit is acceptable. Depending on the embodiment, the presently disclosed method may accept the circuit descriptions in a higher level hardware description language, or such a language may be compiled into a netlist, and the netlist entered for further processing by the disclosed method.

Locating the input side boundary 13 proceeds by finding equivalences in the original logic and in the modified logic starting from the primary input elements (PI) of the original circuit 10. The equivalences are found using structural and functional correspondences.

Figure 2:
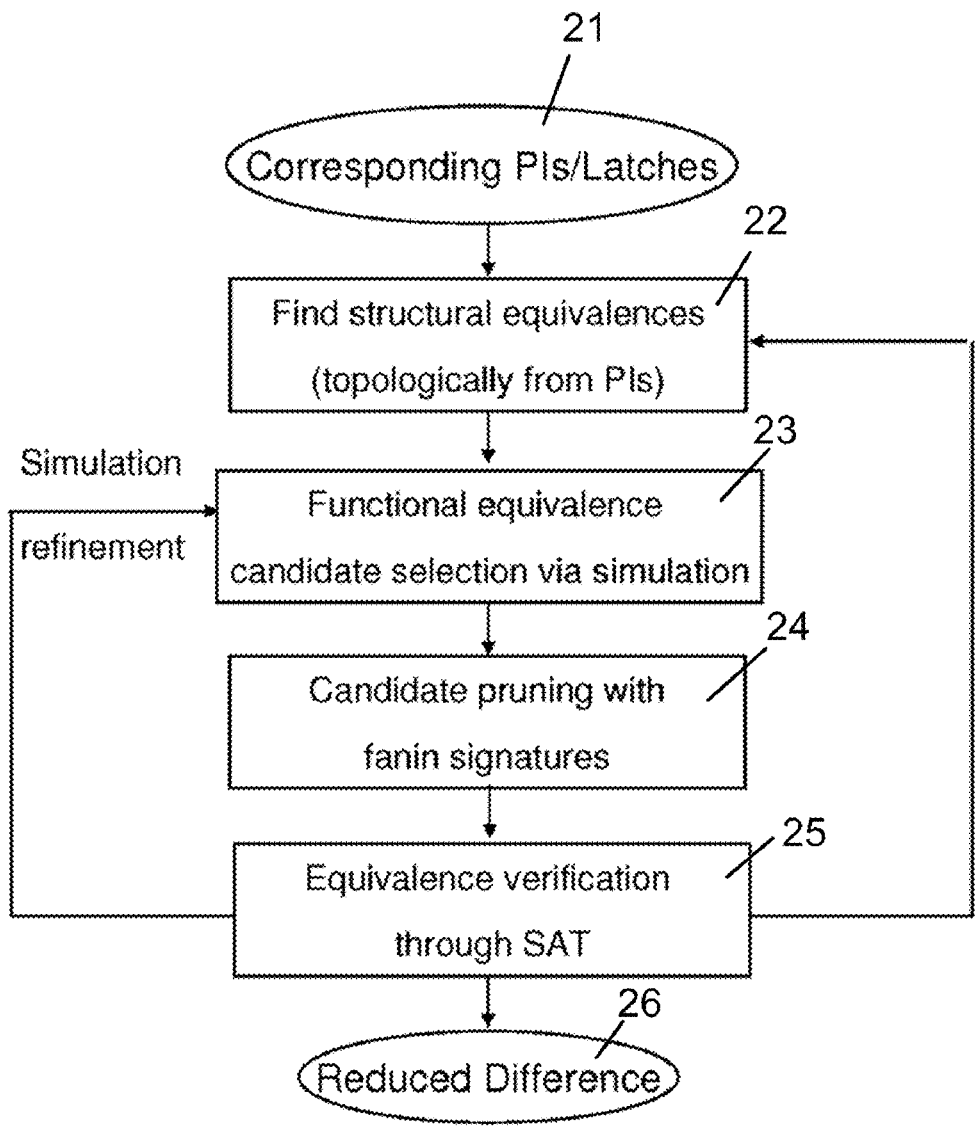
FIG. 2 shows a flowchart for locating an input-side boundary in the original logic.

FIG. 2 shows a flowchart for locating an input side boundary in the original logic. Starting with the given list of corresponding primary inputs and latches 21, a new correspondence list "L" between matched signals in the original and modified circuits is built. Matches are found both structurally 22 and functionally 23. Candidates for functional equivalence are identified by comparing simulation responses 24, and verified using Boolean satisfiability (SAT) 25. With each equivalence found, the size of the difference circuit 15 which at the beginning equaled the original circuit 10, is being reduced 26.

Figure 3A:
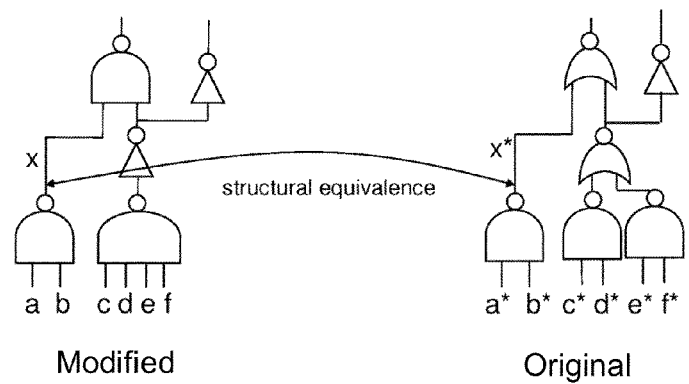
FIG. 3A shows an example for locating structural equivalences.

Structural equivalences 22 are found inductively, starting with corresponding primary inputs and latch outputs. All gates g;g' whose input signals correspond, and whose functions are identical, are added to the correspondence list. The correspondence list can keep track of all pair wise correspondences (in the case of one to many correspondences that can occur with redundancy removal). This process is then repeated until no further gate-outputs are found structurally. FIG. 3A shows an example for locating input side structural equivalences. The initial correspondence list is L={f(a;a*)(b; b*)(c;c*)(d;d*)(e;e*)(f;f*)}. Since both the inputs to the gate with output x are in L, one may examine gate x* in the original circuit. Since this gate is of the same type as x, (x;x*) can be added to L based on structural equivalence.

In order to generate candidate functional equivalences the combinational logic is simulated 23. The simulation proceeds by first assigning common random input vectors to signal-pairs in L. Signals with the same output response on thousands of input vectors (simulated in a bit-parallel fashion) are considered candidates for equivalence. These candidates are further pruned by comparing a pre-computed fanin 24 signature for each of these candidate signals. A fanin signature has bit position representing each primary input and latch in the design. This bit is set if the primary input or latch in question is in the transitive fanin cone of the signal and unset otherwise. Fanin signatures for all internal signals can be pre-computed in one topological traversal of the circuit.

Equivalences for the remaining candidates are verified using SAT 25, a technique known in the art. Briefly, miters are constructed between candidates signals by connecting the corresponding primary inputs together and check for SAT. A miter is a circuit made by taking the exclusive-or (XOR) of corresponding outputs of the candidate pair. UNSAT assignments can be used to update simulation vectors. One may note that it is not necessary for all intermediate signals to be matched. For instance, if two non-identical signals may be merged due to local observability don't cares (ODCs), then downstream equivalences will be detected after the point at which the difference between the signals becomes unobservable. After functional equivalences are found, all of the gates driving the signals in L can be deleted from the difference circuit.

Figure 3B:
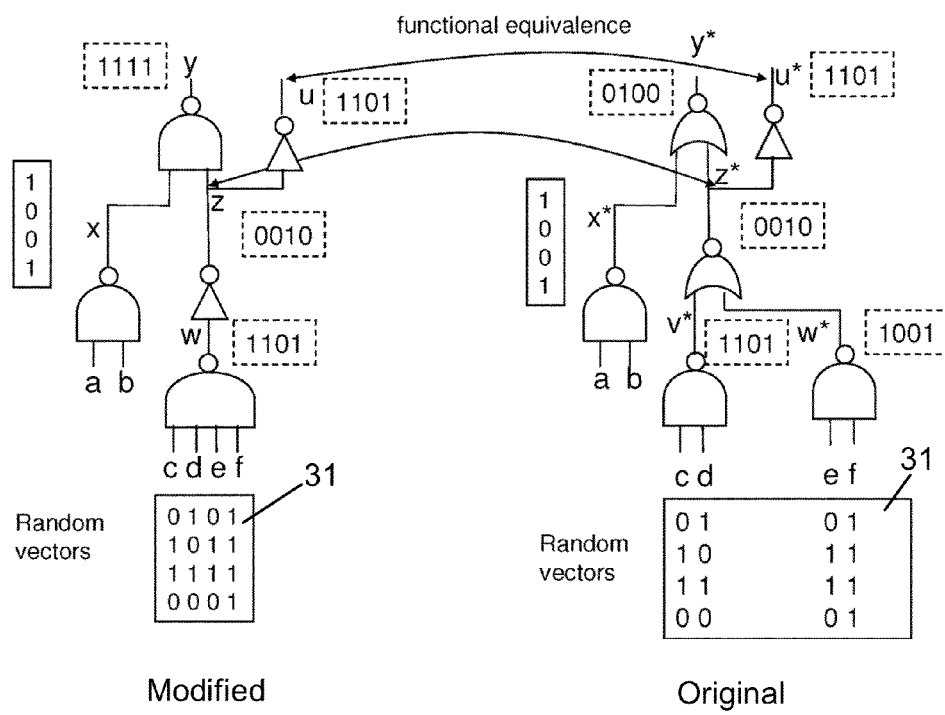
FIG. 3B shows an example for locating functional equivalences.

FIG. 3B shows an example for locating input side functional equivalences. The same set of four random vectors 31 are assigned to corresponding input and internal signals. The output responses to each of the inputs is listed horizontally. The simulations suggest that (z;z*); (u;u*); (w;v*) are candidate-equivalences. However, the fanin list of w contains PIs c;d;e;f, while the list for v* contains c and d. Therefore, (w;v*) are not equivalent, but (z;z*) and (u;u*) may be equivalent and they may be then be further checked using SAT.

Locating of the output-side boundary involves using subcircuit matching, commenced at the primary outputs, to find reusable subcircuits within the original circuit. A subcircuit is simply a portion of the circuit in question. The subcircuit may only be a single gate, or it may be a large of collection of gates, even as large as a significant fraction of the circuit in question. Embodiments of the method find subcircuits that are functionally equivalent under some permutation of intermediate signals. Since modifications, specifically ECOs, tend to be small changes in large netlists, there may be large areas of logic that are identifiably unchanged once the dependence on the changed logic is removed. In other words, once the "output-side boundary" of the change is disconnected, the remaining logic should be equivalent under an appropriate association (connection) of internal signals.

At the outset, the task of finding matching subcircuits for reuse may seem to be computationally complex because it is unclear where the potentially matching subcircuits are located within the modified and original circuits. Enumerating all possible subcircuits (or even a fraction of them) is a computationally intractable task with exponential complexity in the size of the circuit. Additionally, once such candidate subcircuits are located, finding an input ordering such that they functionally match, it is known that by is itself being an NP-complete problem; known as p-equivalence Boolean matching. While these problems are generally high in complexity, taking advantage of two context-specific properties they may become tractable:

1. Most modifications, specifically ECOs, are small changes in logic.
2. The majority of logic optimizations performed on the implementation of the original logic at the time it was initially designed, involve local transformations that leave the global structure of the logic intact.

Since one expects the change in logic to be small, regions of the circuit farther from the primary input elements boundaries are more likely to match. Therefore, one may enumerate subcircuits starting from corresponding primary output elements (PO) in order to find upstream matches. Due to the second property above, one may be able to utilize local subcircuit enumeration. The enumerated subcircuits are being limited by a preset width in their inputs. This limit may be in the range of 7 to 20, with 10 being a preferred value. However, after each subcircuit pair is matched, the matching algorithm is recursively invoked on the corresponding inputs of the match, and thereby the matched subcircuits undergo enlargement.

Figure 4:
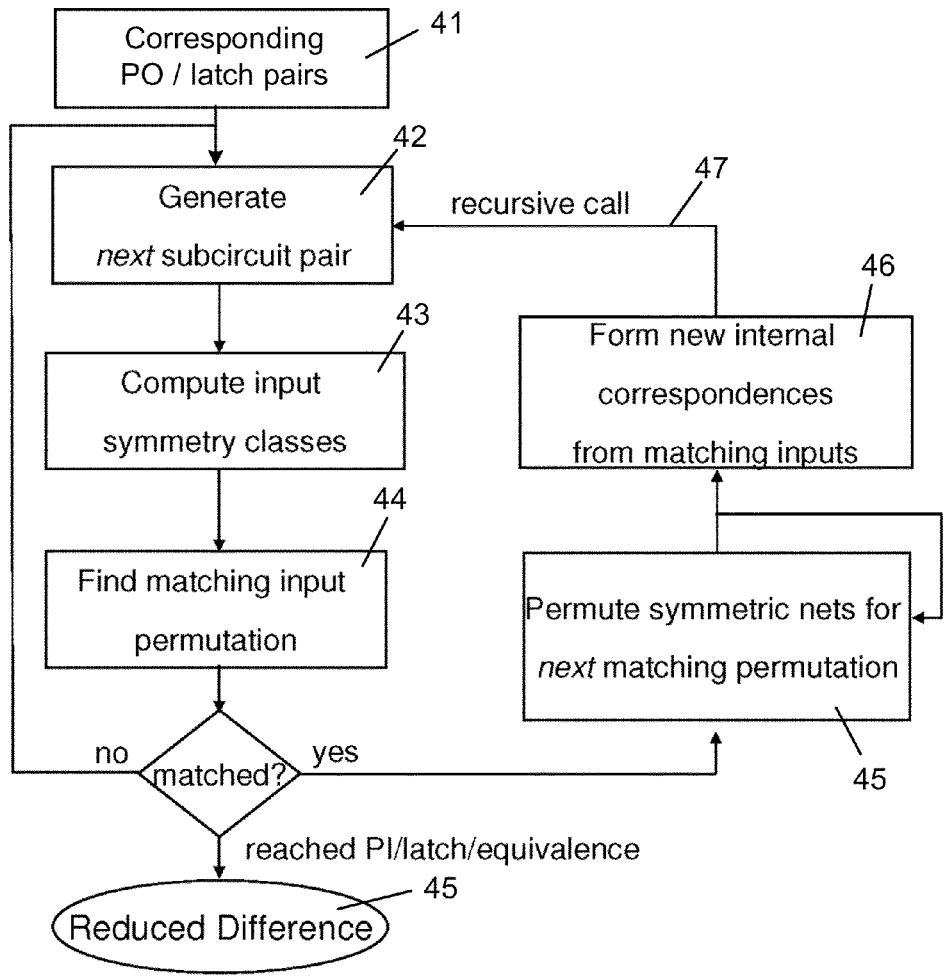
FIG. 4 shows a flowchart for locating an output side boundary in the original logic.

FIG. 4 shows a flowchart for locating an output side boundary is the original logic, illustrating the main steps of subcircuit identification and matching. Candidate subcircuits are generated by expanding two corresponding PO-s 41 along their fanin cone. For each candidate subcircuit pair 42, input symmetry classes 43 are found, and one input order under which the two circuits are equivalent 44 (if such an order exists). From this, one is able to enumerate all input orders 45 under which the circuits are equivalent. From the matching input permutations one may find new internal correspondences 46. For each matching input order, the method recursively calls 47 on the corresponding inputs of the two subcircuits. Every matched subcircuit reduces 48 the difference circuit from the output side of the original circuit.

Subcircuit identification involves subcircuit enumeration coupled with subcircuit expansion. A subcircuit for the embodiments of the present disclosure is defined as follows:

a subcircuit C consists of the logic cone between one output O, and a set of inputs $\{i_1, i_2, \ldots i_a\}$. Pairs of subcircuits, one from the original circuit, and one from the modified circuit are enumerated in tandem.

In order to find matching subcircuits for a pair nets, N from the modified circuit and N* from the original circuit, subcircuits in each circuit are being enumerated. A new "subcirc_enum" data structure is instantiated and initialized with the two outputs N, N*. The data structure contains two queues, one for enumerating subcircuits from the modified circuit which drive N and the other for enumerating subcircuits from the original circuit which drive N*. The eco_queue (as stated earlier, "eco" and "mod" are used equivalently) and orig_queue initially contain subcircuits consisting only of the immediate gates driving N and N*. New subcircuits are then generated by calling next subcircuit pair until all subcircuits are exhausted.

For illustration, the pseudocode for subcircuit enumeration is shown below. This, as well as, all other codes shown in the instant specification are given in the C++ programming language. However this should not be interpreted as limitation. The choice of programming language is for illustration purposes only. It is known in the art that the same procedures, objects, or any other constructs, can be encoded in a variety of different languages. The embodiments of the presented method are not tied any particular programming language.

First pseudocode illustration, for subcircuit enumeration:

```
bool NEXT_SUBCIRCUIT_PAIR(subcircuit C_eco, subcircuit C_orig)
{
    do
        if (eco_queue.empty( ))
            return FALSE
        C_eco = eco_queue.front( )
        if(orig_queue.empty( ))
            eco_queue.pop( )
            expand_subcircuit(C_eco, eco_queue)
            orig_queue.clear( )
            orig_queue.push(new_subcircuit(driver(O*)))
        C_orig = orig_queue.front( )
        orig_queue.pop( )
        expand_subcircuit(C_orig, orig_queue)
    while(pair_history, find(C_eco, C_orig))
    pair_history.add(C_eco, C_orig)
    return TRUE
}
```

The get next_subcircuit_pair function fills in the variables C and C*. When the orig_queue and the eco_queue are both empty, then all possible pairs of subcircuits have been enumerated for the pair (N;N*), and the process terminates.

Figure 5:
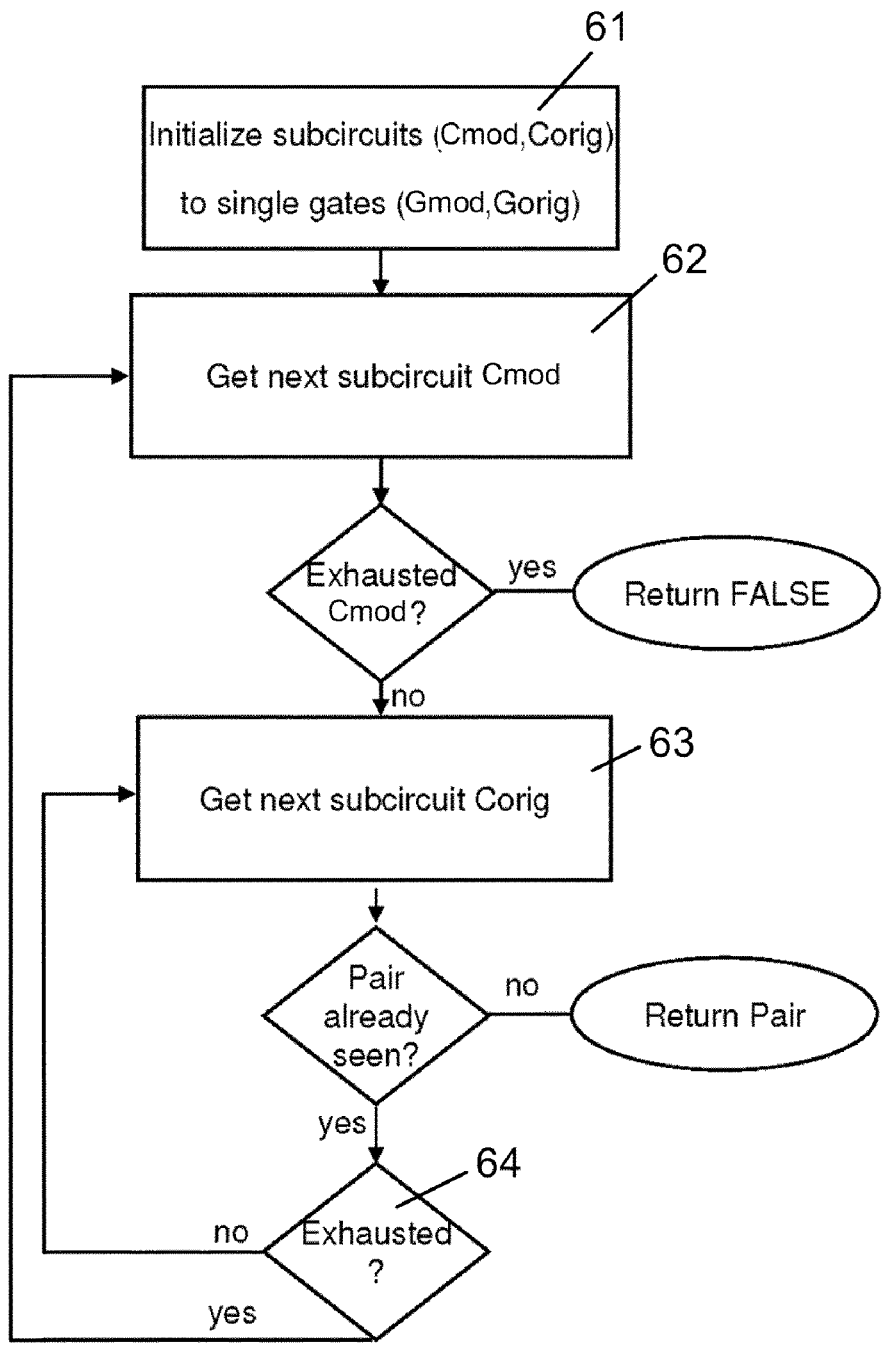
FIG. 5 shows a flowchart for subcircuit enumeration.

FIG. 5 shows a flowchart for the subcircuit enumeration. Cmod and Corig subcircuits are initially equated with the output drivers Gmod and Gorig 61. The one cycles through all possible Cmod subcircuits 62, and for each Cmod cycles through all possible Corig subcircuits 63, until all pair combinations have been enumerated 64.

Figure 6:
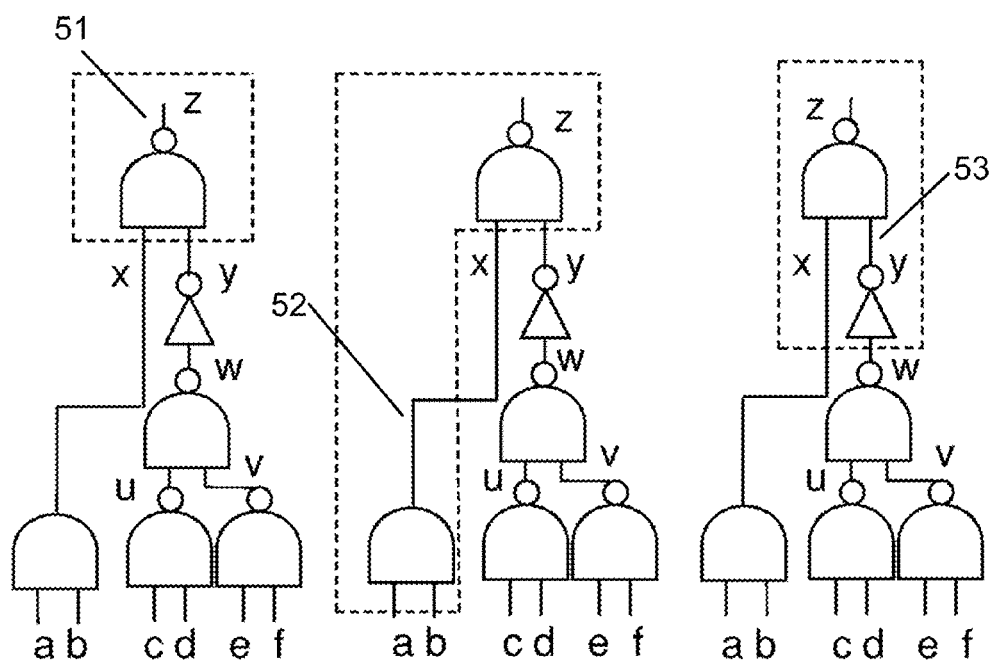
FIG. 6 illustrates subcircuit enumeration.

FIG. 6 illustrates subcircuit expansion. Each subcircuit in the pair starts as a single gate and expands to incorporate the drivers of its inputs. For instance, in FIG. 5, the subcircuit initially contains only the gate 51 driving primary output z and then expands in both the "x" 52 and "y" directions 53. The expansion in a particular direction is stopped when the input being expanded is a) a primary input, b) a latch, c) a previously identified equivalence, d) a previously matched signal, e) the added gate increases the subcircuit width beyond the maximum allowed width, or f) the signal being expanded has other fanouts outside the subcircuit (signals with multiple fanouts can only be at the output of a subcircuit).

Having identified subcircuits, commencing from the output side, through expansion and enumeration: FIGS. 5 and 6, one has to find which subcircuit pairs are logical matches, with one subcircuit each coming from the modified and one form the original circuit for each pair.

For two candidate subcircuits (C,C*) realizing the Boolean functions F(i1, i2, . . . in) and F*(i1*, i2*, . . . in*) respectively, the goal is to find all of the permutations of the inputs of F* such that F=F*.

To find such permutations, if they exist, one may use the process as is being outlined herein.

A matching permutation p(F*,F) of a function F*(i1, i2, . . . , in) with respect to a function F, is defined as a permutation of its inputs such that F*(ρ(F*,F)(i1), ρ(F*,F)(i2), . . . ρ(F*,F)(in))=F.

Two inputs ix and iy of a function F are said to be symmetric with respect each other if F(i1, i2, . . . ix, . . . iy . . . in)=F(i1, i2, . . . iy, . . . ix . . . in)

Given a function F and a partition of its inputs into symmetry classes: sym_F={sym_F[1],sym_F[2], . . . sym_F[n]}, a symmetric permutation τF on the inputs of F is a composition of permutations on each symmetry class τF=τsym_F[1] τsym_F[2] . . . τsym_F[n]. Each constituent permutation τsym_F[i] leaves all variables not in sym_F[i] fixed.

Having stated the definitions of matching permutations, symmetric inputs, and symmetric permutations, the following proposition may allow one to derive all matching input permutations for F and F*: given a matching permutation ρ(F*,F), all other matching permutations π(F*,F) can be derived by composing a symmetric permutation τ with ρ(F*, F), i.e., π(F*,F)=ρ(F*,F)°τ for some symmetric permutation τ.

The proof of this proposition goes as follows: Assume there exists a matching permutation π(F*,F) that cannot be derived by composing a symmetric permutation with ρ(F,F*). Then, there is a permutation φ which permutes a set of non-symmetric variables S' such that ρ(F,F*)°φ=π(F*,F). However, by definition of symmetry F*(ρ(F,F*)(φ(i1)), ρ(F,F*)(φ(i2)), ρ(F,F*)(φ(i3)) . . . )≠F*(ρ(F,F*)(i1),ρ(F,F*)(i2),ρ(F,F*)(i3)). By transitivity F*(ρ(F,F*)(φ(i1)), ρ(F,F*)(φ(i2)), ρ(F,F*)(φ (i3)) . . . )≠F. Therefore, π(F*,F) cannot be a matching permutation. For the other side, suppose φ is any symmetric permutation of F* then by definition of symmetry F*(φ(i1), (φ(i2),φ(i3) . . . )=F*(i1, i2, i3 . . . ) and by definition of matching permutation: F*(ρ(F,F*)(φ(i1)), ρ(F,F*)(φ(i2)), ρ(F,F*)(φ(i3)) . . . )=F*(ρ(F,F*)(i1), ρ(F,F*)(i2), ρ(F,F*) (i3))=F. Therefore, ρ°φ is also a matching permutation of F* with respect to F.

The proven proposition suggests that all matching permutations can be derived in these steps:

1. Computing the set of input symmetry classes for each Boolean function, i.e., for a function F one computes sym_F={sym_F[1],sym_F[2], . . . sym_F[n]} where classes form a partition of the inputs of F and each input is contained in one of the classes of sym_F.
2. Deriving one matching permutation for F and F* through the use of a Boolean matching method. Since the subcircuits were chosen with a limited width, truth tables may be computed for both the subcircuits Boolean matching may be done with manipulations on the truth table bitsets.
3. Permuting symmetric variables within the matching permutations derived in step 2 above.

In order to obtain the set of symmetry classes for a Boolean function F one may re-compute the truth-table bitset after swapping pairs of inputs. This method has complexity $O(n^2)$ for a circuit of width n, which width as stated earlier, is limited to be in the range of 7 to 20, with 10 being a preferred value. The method to obtain the set of symmetry classes for F is shown by the second pseudocode illustration:

```
COMPUTE_SYM_CLASSES(function F)
{
    unclassified[ ] = all_inputs(F)
    do
        curr = unclassified[0]
        for(i < |unclassified|)
            F¹ = swap(F, curr.unclassified[i])
            if(F¹ == F)
                new_class.add(unclassified[i])
            new_class.add(curr)
            sym_F.add(new_class)
            unclassified[ ] = all_inputs(F) −symmetry_classes
    while(!unclassified.empty( ))
    return sym_F
}
```

Figure 7:
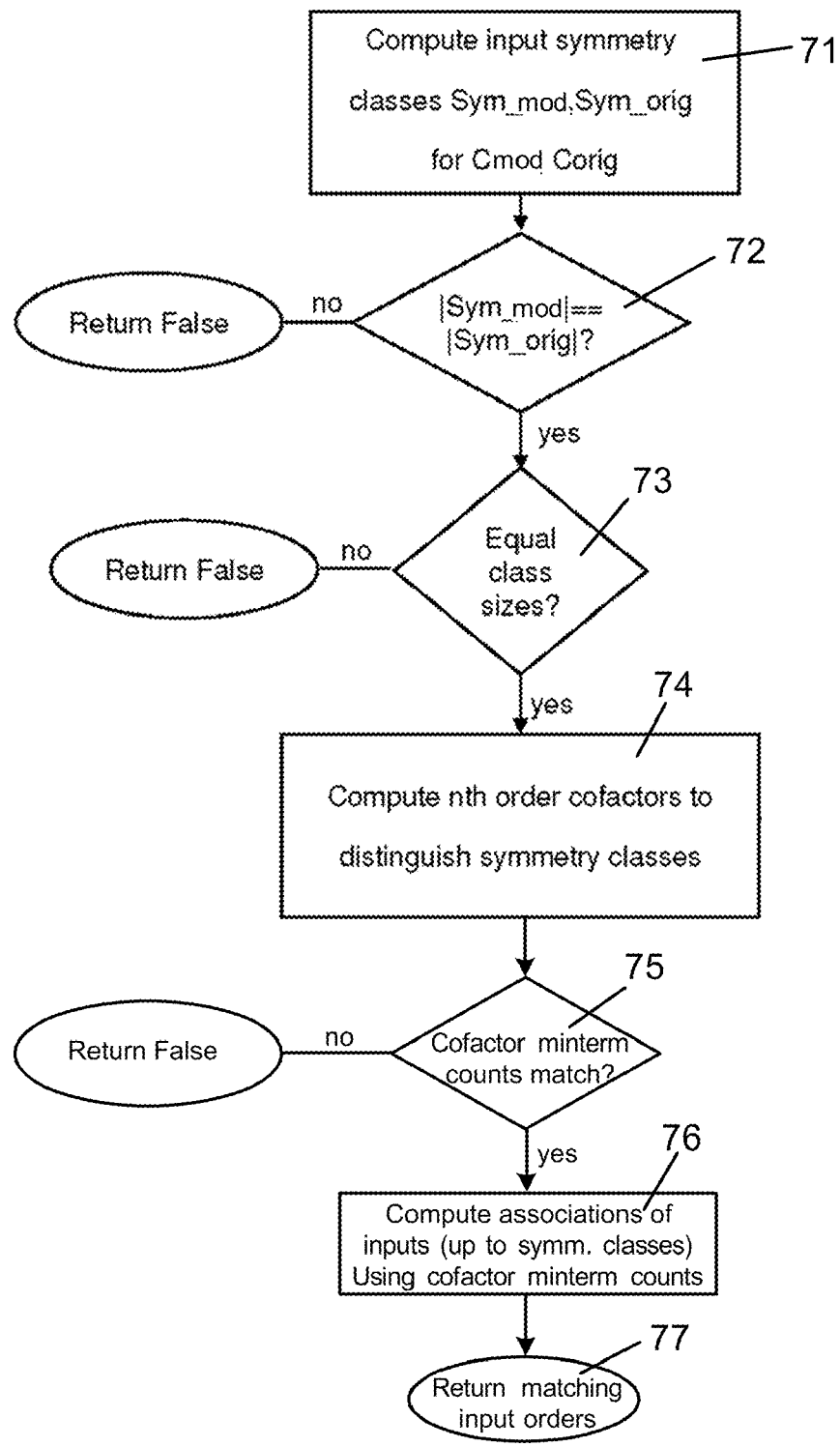
FIG. 7 shows a flowchart for finding matching input permutations for candidate subcircuits.

One may derive a matching input permutation F*, F for subcircuits Corig and Cmod, or determine that one does not exist as shown on the FIG. 7 flowchart. The input symmetry classes 71 for F* and F have already been computed, for instance through the procedure illustrated by the second pseudocode. First, one may check whether number of inputs in both the functions is the same 72. Next, one may check the sizes and number of symmetry classes 73. If the symmetry classes all have unique sizes, then the classes are considered resolved. If the symmetry classes of F and F* are resolved, they can be associated with each according to class size and immediately checked for equivalence.

If the symmetry classes do not have distinctive sizes, one may use methods known in the art to determine a permutation of the variables of F* up to symmetry classes with the use of minterm counts of cofactors. Minterm of a function f(x1, x2, . . . , xn) is an assignment to the variables x1=y1, x2=y2, . . . xn=y3, where each yi is the constant 0 or 1 such that f(y1, y2, . . . , yn)=1. A positive cofactor of a Boolean function f(x1,x2,x3, . . . , xn) with respect to variable xi is the function that results when xi=1 is substituted into the function, i.e. f(x1, x2, . . . , xi−1, 1, xi+1, . . . , xn). A negative cofactor with respect to xi is defined similarly but with xi=0.

The function "matching_cofactor_order" in the third pseudocode, shown below, carries out this procedure. Cofactors with respect to every subset of variables are computed 74, as necessary. First cofactors with respect to a single variable are computed, then pairs, etc., for representative members of each unresolved symmetry class, and checked for equality 75. Then, the minterm counts of the $n^{th}$-order cofactors 76 are used to associate the classes of F with those of F*. This determines a permutation 77 of the variables of F* up to symmetry classes.

Figure 8:
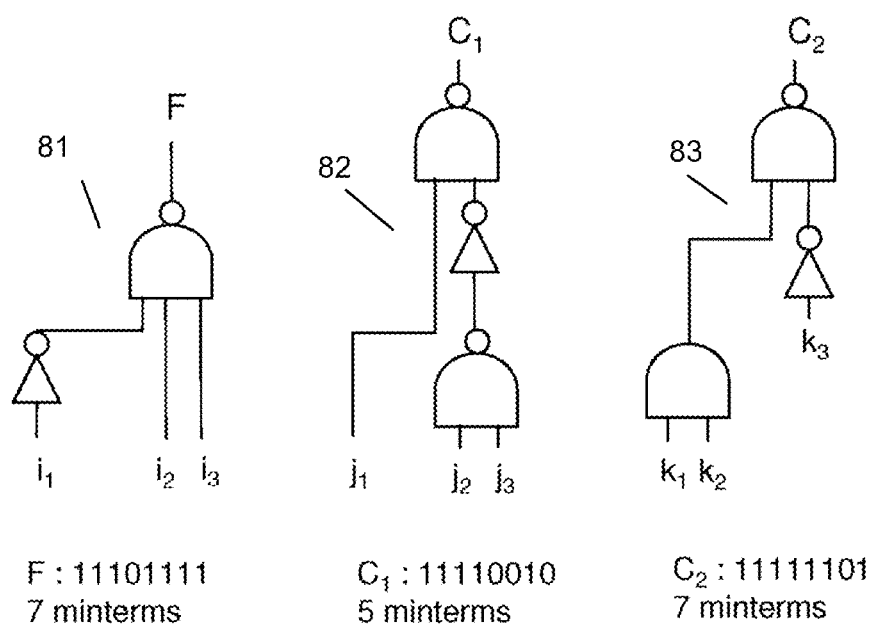
FIG. 8 shows a simple example of minterm tests of candidate subcircuits for matching.

FIG. 8 shows a simple example of minterm tests of candidate subcircuits for matching. For the three subcircuits 81, 82, 83 upon applying all possible input permutations the Boolean output functions are F, $C_1$, $C_2$. The minterm count of F and $C_2$ match, that of $C_1$ does not. Accordingly, 81 and 83 are candidate subcircuits for match under p-equivalence, while $C_1$ is not.

The following, third, pseudocode illustration shows the derivation of a matching permutation of F, F*, or determination that one does not exist:

```
bool COMPUTE_MATCHING_PERM_ORDER(function F, funtion F*)
{
    if(|inputs(F)|! = |inputs(F*)|)
        return UNMATCHED
    sym_F = compute_sym_classes(F)
    sym_F* = compute_sym_classes(F*)
    sort_by_size(sym_F)
    sort_by_size(sym_F*)
    if(|sym_F|! = |sym_F*|)
        return UNMATCHED
    for(0 <= i < |sym_F|)
        if(|sym_F[i]|! = |sym_F*[i]|)
            return UNMATCHED
    if(resolved(sym_F*))
        reorder(F*,sym_F*)
        reorder(F,sym_F)
        if(F* == F) return MATCHED
        else return UNMATCHED
    if(matching_cofactor_order(F,sym_F,F*,sym_F*))
        return MATCHED
    else
        return UNMATCHED
}
```

In this, third, pseudocode, instead of specifying permutations ρF,F*, one may directly specify the ordering on the variables in F* that is induced by p when F is ordered in what may be called a symmetry class order, i.e. F with symmetric variables adjacent to each other, as shown here: F(sym_F[1][1],sym_F [1][2], . . . sym_F[1][n],sym_F[2][1],sym_F[2][2], sym_F[2] [n]). The reorder(F,sym_F) function in the pseudocode is used to re-compute the functions F according to the order suggested by sym_F (and similarly with F*).

The remaining matching input permutations are derived by enumerating symmetric permutations as allowed by the above proved proposition. The following, fourth, pseudocode illustration shows the derivation of these remaining matching input permutations:

```
NEXT_MATCHING_PERM_ORDER(sym_classes sym_F*,
function F*)
{
    index = −1
    for(0 <= i < |sym_F*|)
        if(next_permutation(sym_F*[i]))
            index = i
            break
    if(index == −1)
        return NULL
    for (0 <= j < i)
        next_permutation(sym_F*[j])
    reorder(sym_F*,F)
}
```

The "next_permutation" function enumerates permutations of individual symmetry classes. Then all possible combinations of symmetry class permutations are composed with each other. The different input orders induced by matching permutations define different associations of intermediate signals between the subcircuit from the original circuit C* and that of the modified circuit C. And, one may note that although two subcircuits can be equivalent under different input orders, the "correct" order leads to larger matches upstream.

Having found subcircuits matching under p-equivalence, one may recursively extend the Boolean matching along to the sub branches of the matched subcircuits, and derive a set of subcircuits of maximal size. This part of the embodiments of the computer executed method of the present invention is called subcircuit covering, with covering meaning a set, or collection, of subcircuits, while subcircuits themselves are defined as a cone of logic.

It may be useful to define a subcover for two corresponding nets (N,N*) as a set of connected matching subcircuit-pairs that drive N and N*. Different subcircuit matches at (N,N*) can lead to different subcovers as shown in FIGS. 9A and 9B.

Figure 9A:
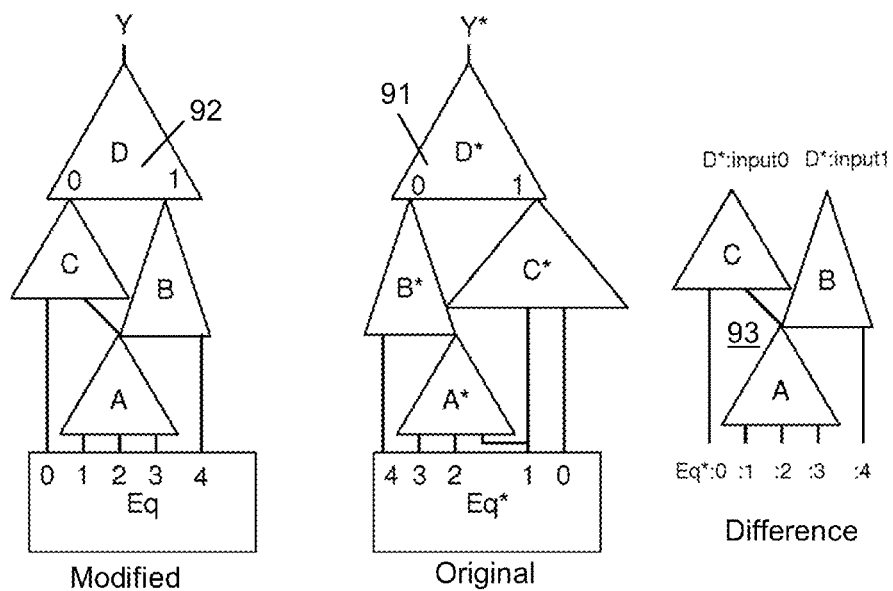
FIGS. 9A and 9B show an example of subcircuit covering using permutations within input symmetry classes.
Figure 9B:
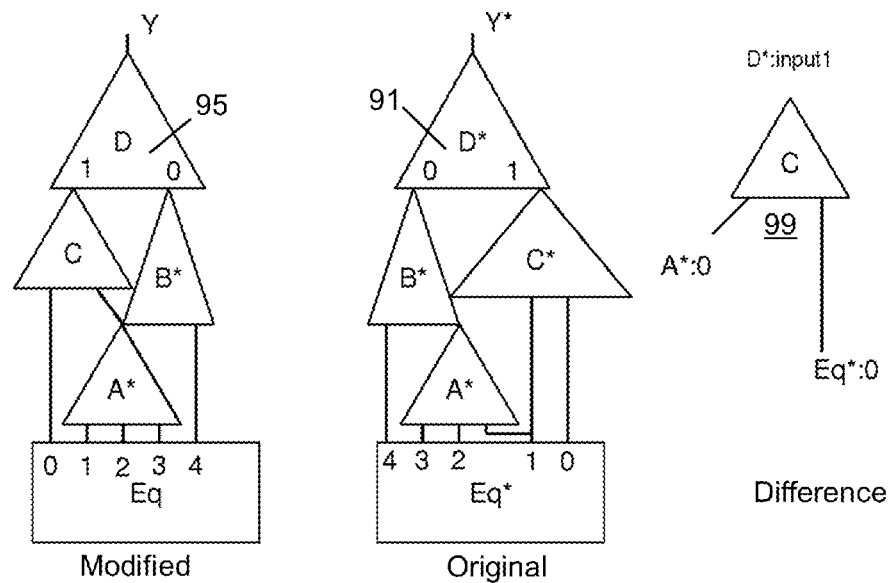

FIGS. 9A and 9B shows an example of subcircuit covering using permutations within input symmetry classes. Once the subcircuit D* of the original circuit and D of the modified circuit are generated through subcircuit enumeration of the first pseudocode algorithm, the algorithm of the third pseudocode finds an input ordering under which they are functionally equivalent. FIG. 9A shows the initial ordering where inputs (0,1) 91 of D* are associated with inputs (0,1) 92 of D. The subcover induced by this ordering is simply {(D, D*)}, leaving the logic difference {A,B,C} 93. However, an alternate input ordering, derived by swapping the two symmetric inputs 95 of D, yields a larger cover.

Since D(1,0)=D*(0,1), the covering algorithm is invoked on the pairs of corresponding inputs of D and D*. The subcircuits (B,B*) are eventually found and matched. The inputs of B, B* are then called for recursive cover computation. One of the inputs of B is an identified functional equivalence, so this branch of recursion is terminated. The recursive call on the other branch leads to the match (A,A*) at which point this recursive branch also terminates due to the fact that all of the inputs of A are previously identified equivalences. The resultant logic difference simply consist of {C} 99. It is notable that this subcover requires a reconnection of the output of A to C which is reflected in the difference circuit.

The following, fifth, pseudocode illustration shows the algorithm to compute the optimal subcover:

```
COMPUTE_COVER(net N, net N*)
{
    subcirc_enum N_enum
    while(N_enum.next_subcircuit_pair(C,C*)){
        F* = compute_truth_table(C*)
        F = compute_truth_table(C)
        sym_F = compute_symm_classes(F)
        sym_F* = compute_symm_classes(F*)
        if(!compute_matching_perm_order(F,F*))
            continue
        do{
            for(0 <= i < |sym_F|)
                for(0 <= j < |sym_F[i]|)
                    if(is_PI_latch_matched(sym_F[i][j]))
                        continue
                    if(is_PI_latch_matched(sym_F*[i][j]))
                        continue
                    compute_cover(sym_F[i][j],sym_F*[i][j])
            this_match = combine_subcovers(sym_F,sym_F*)
            if(|this_match| > |opt_match(N,N*)|)
                opt_match(N, N*) = this_match
        }while(next_matching_perm_order(sym_F*))
    }
    mark_matched_gates(opt_match(N,N*))
}
```

This algorithm selects from all the matching input permutations an optimal matching input permutation, which optimal matching input permutation gives the greatest enlargement of the matched subcircuit pair. The algorithm starts by enumerating all subcircuit pairs, using the first pseudocode, and matching permutations, using the fourth pseudocode, under which two subcircuits are equivalent. The function is recursively invoked at the input of each matching mapping in order to extend the cover upstream in logic. For each match C_eco; C_orig with input correspondence {(i1, j1), (i2, j2), (i3, j3) . . . } (defined by the matching permutation), the best induced subcover is computed by combining best subcovers opt_match(i1, j1), opt_match(i2, j2) . . . at the inputs of the match. The subcovers are corrected for any conflicting matches during the process of combining. For example, if a net in the modified circuit has higher fanout than a net in the original circuit then different subcovers may correspond in the modified circuit net with different original circuit nets. When such conflicts occur, the correspondence that results in the larger subcover is retained.

In this process, one may search for matches starting with topologically corresponding primary outputs, and further topological correspondences emerge from the matching processes. Since topologically connected gates are likely to be placed close to each other during physical design, many of the timing characteristics of the original implementation are preserved in reused logic. After a subcircuit cover is found, the outputs of subcircuit-pairs are added to the correspondence list L and all the covered gates in the modified circuit are removed from the difference circuit.

Figure 10:
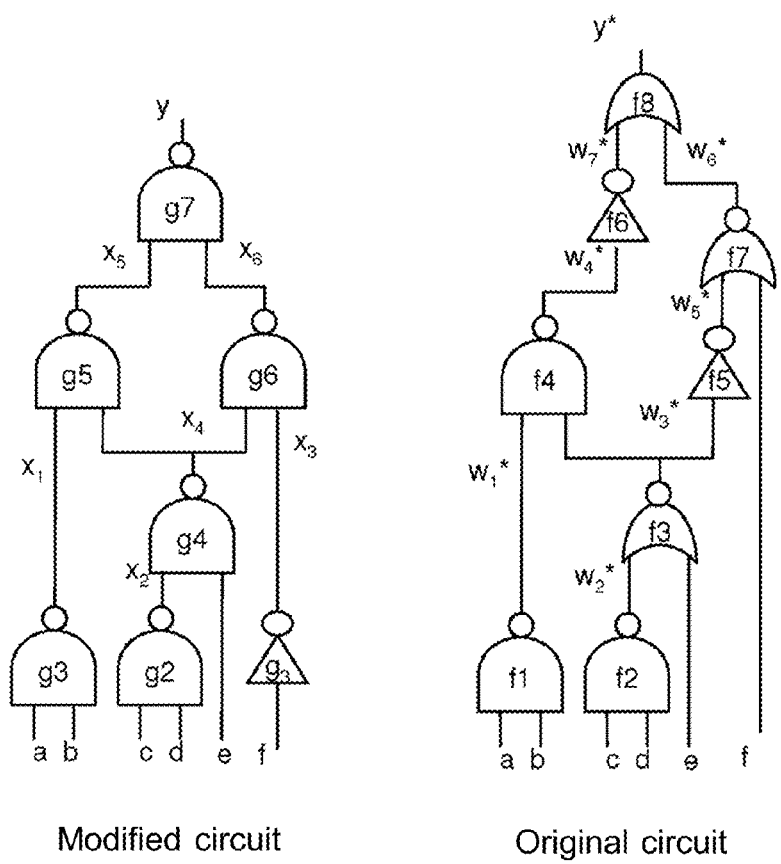
FIG. 10 shows a simple example of an operation of the disclosed method.

Having presented in the embodiments of the present disclosure with detailed algorithms and codes it may be illustrative to show the operation of the method, from the input and output side on an intuitively simple example circuits. FIG. 10 shows a simple example of an operation of the disclosed method.

By inspection, it is clear that f 3, which was modified from a NOR to a NAND gate, is the only difference between the two circuits. Although some of the local logic has undergone equivalent transformations (gates g6 and g7 have been modified through the application of DeMorgan's law), most of the circuit retains its global structure. The nearby logic in the original circuit being unrecognizable despite the actual change being small is typical of ECO examples.

Embodiment of the presented method recognize and isolate such changes as follows: The input side phase involves structural and functional equivalence checking. For the given example, the equivalences x1=w1*, x2=w2* are recognized by these techniques. The output side phase is geared towards finding matching subcircuits from the primary outputs. Through a careful process of subcircuit enumeration and subcircuit-input mapping, the subcircuits consisting of {f5, f6, f7, f 8} from the original circuit, and {g3, g6, g7} are matched (using Boolean matching techniques) under the intermediate input mapping {(x5,w4*), (x4,w3*), (f,f)}. This match leads to an additional match between g5 and f4 when the matching algorithm is recursively called on signals x5 and w4*. The conclusion of the two phases leaves the single-gate difference of g4, as desired.

Figure 11A:
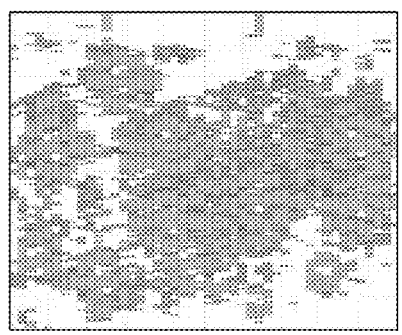
FIGS. 11A, 11B, and 11C show an example result of the effectiveness of an embodiment of the disclosed method.
Figure 11B:
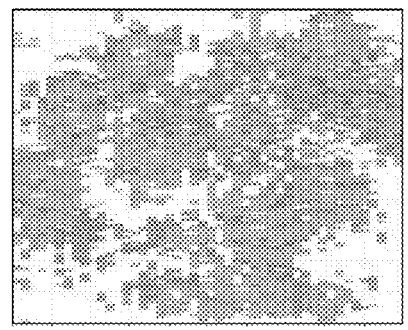
Figure 11C:
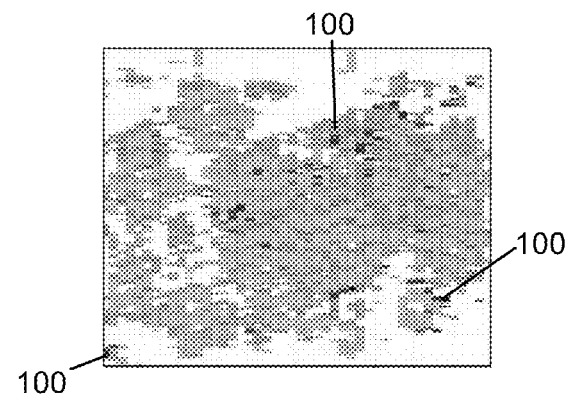

Embodiments of the method have been applied to circuits having tens of thousands of gates with excellent results. Such an example is shown in FIGS. 11A, B, C. Layouts of the original circuit FIG. 11A, of the modified circuit as placed as a new independent circuit FIG. 11B, and of the incremental placement with the difference circuit stitched FIG. 11C, are shown. Where nets have been added, or deleted, due to the incremental placement those places are blackened out, as pointed out 100 for a few of these. Most of the blackened placements represent additions rather than omissions.

By obvious inspection, the original circuit of FIG. 11A and the final circuit of FIG. 11C (with the difference circuit stitched in) look very similar. While, the entirely re-placed modified circuit of FIG. 11B appears significantly different. Preserving the placement generally has the effect of preserving wire routes and also maintaining slack. In summary, results indicate that by isolating the boundaries of the logic change, an embodiment of the presented method is able to automatically identify changes which leave a large portion of the design unperturbed through the design flow.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

Many modifications and variations of the present invention are possible in light of the above teachings, and could be apparent for those skilled in the art. The scope of the invention is defined by the appended claims.

The invention claimed is:

1. A computer-executed method, comprising:
accepting an original circuit, wherein said original circuit has an original logic, and wherein said original logic comprises primary output elements;
accepting a modified circuit, wherein said modified circuit represents a modified logic for said original circuit;
synthesizing a difference circuit, wherein said difference circuit represents changes to said original logic, wherein said changes implement said modified logic for said original circuit; and
wherein said synthesizing comprises: locating an output-side boundary in said original logic, wherein in between said output-side boundary and said primary output elements said original logic is free of said changes.

2. The computer-executed method of claim 1, wherein both said original circuit and said modified circuit contain subcircuits, and wherein said locating of said output-side boundary comprises:
using subcircuit matching to find reusable subcircuits amongst said subcircuits of said original circuit, wherein said subcircuit matching is commenced at said primary output elements.

3. The computer-executed method of claim 2, wherein said subcircuit matching comprises:
identifying a candidate subcircuit pair, wherein one subcircuit each in said candidate subcircuit pair is selected respectively from said original circuit and from said modified circuit;
applying Boolean matching on said candidate subcircuit pair; and
accepting said candidate subcircuit pair as a matched subcircuit pair if said Boolean matching is successful.

4. The computer-executed method of claim 3, wherein said locating of said output-side boundary further comprises subcircuit covering, wherein said matched subcircuit pair has input branches, and wherein said subcircuit covering comprises:
recursively extending said Boolean matching along said input branches; and
adding said input branches to said matched subcircuit pair if said recursively extending is successful, whereby said matched subcircuit pair undergoes an enlargement.

5. The computer-executed method of claim 4, wherein said Boolean matching comprises:
computing truth tables for both said subcircuits of said candidate subcircuit pair;
computing input symmetry classes for both said subcircuits of said candidate subcircuit pair using said truth tables, wherein said input symmetry classes have symmetric variables; and
permuting said symmetric variables within said input symmetry classes, thereby obtaining matching input permutations for both said subcircuits of said candidate subcircuit pair.

6. The computer-executed method of claim 5, wherein said subcircuit covering further comprises:
selecting from said matching input permutations an optimal matching input permutation, wherein said enlargement of said matched subcircuit pair is greatest with said optimal matching input permutation.

7. The computer-executed method of claim 2, wherein said locating of said output-side boundary further comprises:
using subcircuit enumeration to find said reusable subcircuits amongst said subcircuits of said original circuit, wherein said subcircuit enumeration is commenced at said primary output elements.

8. The computer-executed method of claim 1, wherein said original logic comprises primary input elements and wherein said synthesizing further comprises:
locating an input-side boundary in said original logic, wherein said changes are confined in between said input-side boundary and said output-side boundary.

9. The computer-executed method of claim 8, wherein said locating of said input-side boundary comprises:
using functional correspondence to find equivalences in said original logic and in said modified logic, wherein said functional correspondence commences at said primary input elements.

10. The computer-executed method of claim 9, wherein said original circuit and said modified circuit are adapted for signal simulations, wherein said functional correspondence comprises:
assigning common random input vectors to a signal-pair derived respectively from said original circuit and from said modified circuit, and checking for a common response in said signal-pair; and
upon finding said common response, assuring said functional correspondence using Boolean satisfiability.

11. The computer-executed method of claim 9, wherein said locating of said input-side boundary further comprises:
using structural correspondence to find said equivalences in said original logic and in said modified logic, wherein said structural correspondence commences at said primary input elements.

12. A computer-executed method, comprising:
accepting an original circuit, wherein said original circuit has an original logic, and wherein said original logic comprises primary input elements;
accepting a modified circuit, wherein said modified circuit represents a modified logic for said original circuit;
synthesizing a difference circuit, wherein said difference circuit represents changes to said original logic, wherein said changes implement said modified logic for said original circuit; and
wherein said synthesizing comprises: locating an input-side boundary in said original logic, wherein in between said input-side boundary and said primary input elements said original logic is free of said changes.

13. The computer-executed method of claim 12, wherein said locating of said input-side boundary comprises:
using functional correspondence to find equivalences in said original logic and in said modified logic, wherein said functional correspondence commences at said primary input elements.

14. The computer-executed method of claim 13, wherein said original circuit and said modified circuit are adapted for signal simulations, wherein said functional correspondence comprises:
assigning common random input vectors to a signal-pair derived respectively from said original circuit and from said modified circuit, and checking for a common response in said signal-pair; and
upon finding said common response, assuring said functional correspondence using Boolean satisfiability.

15. The computer-executed method of claim 14, wherein said locating of said input-side boundary further comprises:
using structural correspondence to find said equivalences in said original logic and in said modified logic, wherein said structural correspondence commences at said primary input elements.

16. A computer program product comprising a non-transitory computer useable medium having a computer readable program code embodied therewith, wherein said computer readable program code when executed on a computer causes said computer to:
accept an original circuit, wherein said original circuit has an original logic, and wherein said original logic comprises primary output elements;
accept a modified circuit, wherein said modified circuit represents a modified logic for said original circuit, and wherein both said original circuit and said modified circuit contain subcircuits;
synthesize a difference circuit, wherein said difference circuit represents changes to said original logic, wherein said changes implement said modified logic for said original circuit; and
wherein said synthesizing comprises: locating an output-side boundary in said original logic, wherein in between said output-side boundary and said primary output elements said original logic is free of said changes.

17. The computer program product of claim 16, wherein said locating of said output-side boundary further causes said computer to:
use subcircuit matching and subcircuit covering to find reusable subcircuits amongst said subcircuits of said original circuit.

18. A computer program product comprising a non-transitory computer useable medium having a computer readable program code embodied therewith, wherein said computer readable program code when executed on a computer causes said computer to:
accept an original circuit, wherein said original circuit has an original logic, and wherein said original logic comprises primary input elements;
accept a modified circuit, wherein said modified circuit represents a modified logic for said original circuit;
synthesize a difference circuit, wherein said difference circuit represents changes to said original logic, wherein said changes implement said modified logic for said original circuit; and
wherein said synthesizing comprises: locating an input-side boundary in said original logic, wherein in between said input-side boundary and said primary input elements said original logic is free of said changes.

19. The computer program product of claim 18, wherein said locating of said input-side boundary further causes said computer to:
use structural correspondence and functional correspondence to find equivalences in said original logic and in said modified logic.

* * * * *